(12) United States Patent
Murakami

(10) Patent No.: US 10,475,645 B2
(45) Date of Patent: *Nov. 12, 2019

(54) METHOD OF FILLING RECESS AND PROCESSING APPARATUS

(71) Applicant: TOKYO ELECTRON LIMITED, Tokyo (JP)

(72) Inventor: Hiroki Murakami, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/270,093

(22) Filed: Feb. 7, 2019

(65) Prior Publication Data

US 2019/0172710 A1  Jun. 6, 2019

Related U.S. Application Data

(63) Continuation of application No. 15/935,616, filed on Mar. 26, 2018.

(30) Foreign Application Priority Data

Mar. 30, 2017  (JP) .................................. 2017-066858

(51) Int. Cl.
*H01L 21/02* (2006.01)
*H01L 21/67* (2006.01)
(Continued)

(52) U.S. Cl.
CPC ...... *H01L 21/02532* (2013.01); *C23C 16/045* (2013.01); *C23C 16/06* (2013.01); *C23C 16/28* (2013.01); *C23C 16/52* (2013.01); *C23C 16/56* (2013.01); *H01J 37/32834* (2013.01); *H01L 21/0243* (2013.01); *H01L 21/0245* (2013.01); *H01L 21/0262* (2013.01); *H01L 21/02488* (2013.01); *H01L 21/02494* (2013.01); *H01L 21/02502* (2013.01); *H01L 21/02592* (2013.01); *H01L 21/02639* (2013.01); *H01L 21/3065* (2013.01); *H01L 21/67109* (2013.01); *H01J 37/32082* (2013.01); *H01J 2237/334* (2013.01);
(Continued)

(58) Field of Classification Search
None
See application file for complete search history.

(56) References Cited

U.S. PATENT DOCUMENTS 6,757,971 B2  7/2004  Sinha
6,855,975 B2  2/2005  Gilton
(Continued)

FOREIGN PATENT DOCUMENTS

JP  20124542 A  1/2012

*Primary Examiner* — Angel Roman
(74) *Attorney, Agent, or Firm* — Nath, Goldberg & Meyer; Jerald L. Meyer

(57) ABSTRACT

A method of filling a germanium film in a recess on a substrate to be processed having an insulating film on which the recess is formed on a surface of the substrate, includes forming a first germanium film so as to fill the recess by supplying a germanium raw material gas to the substrate, etching the first germanium film with an etching gas containing an excited $H_2$ gas or $NH_3$ gas, and forming a second germanium film on the first germanium film so as to fill the recess by supplying a germanium raw material gas.

2 Claims, 12 Drawing Sheets

(51) Int. Cl.
  *C23C 16/04*    (2006.01)
  *C23C 16/06*    (2006.01)
  *H01J 37/32*    (2006.01)
  *C23C 16/56*    (2006.01)
  *C23C 16/52*    (2006.01)
  *H01L 21/3065*  (2006.01)
  *C23C 16/28*    (2006.01)

(52) U.S. Cl.
  CPC .......... *H01J 2237/3321* (2013.01); *H01J 2237/3323* (2013.01); *H01L 21/02667* (2013.01); *H01L 21/67069* (2013.01)

(56) References Cited

U.S. PATENT DOCUMENTS

| | | |
|---|---|---|
| 6,946,392 B2 | 9/2005 | Sinha |
| 9,997,351 B2 | 6/2018 | Chen et al. |
| 2003/0041452 A1 | 3/2003 | Sinha |
| 2007/0246439 A1 | 10/2007 | Lee et al. |
| 2011/0001107 A1 | 1/2011 | Zheng |
| 2015/0348840 A1 | 12/2015 | Bamnolker et al. |
| 2018/0286673 A1* | 10/2018 | Murakami .......... H01L 21/0243 |

\* cited by examiner

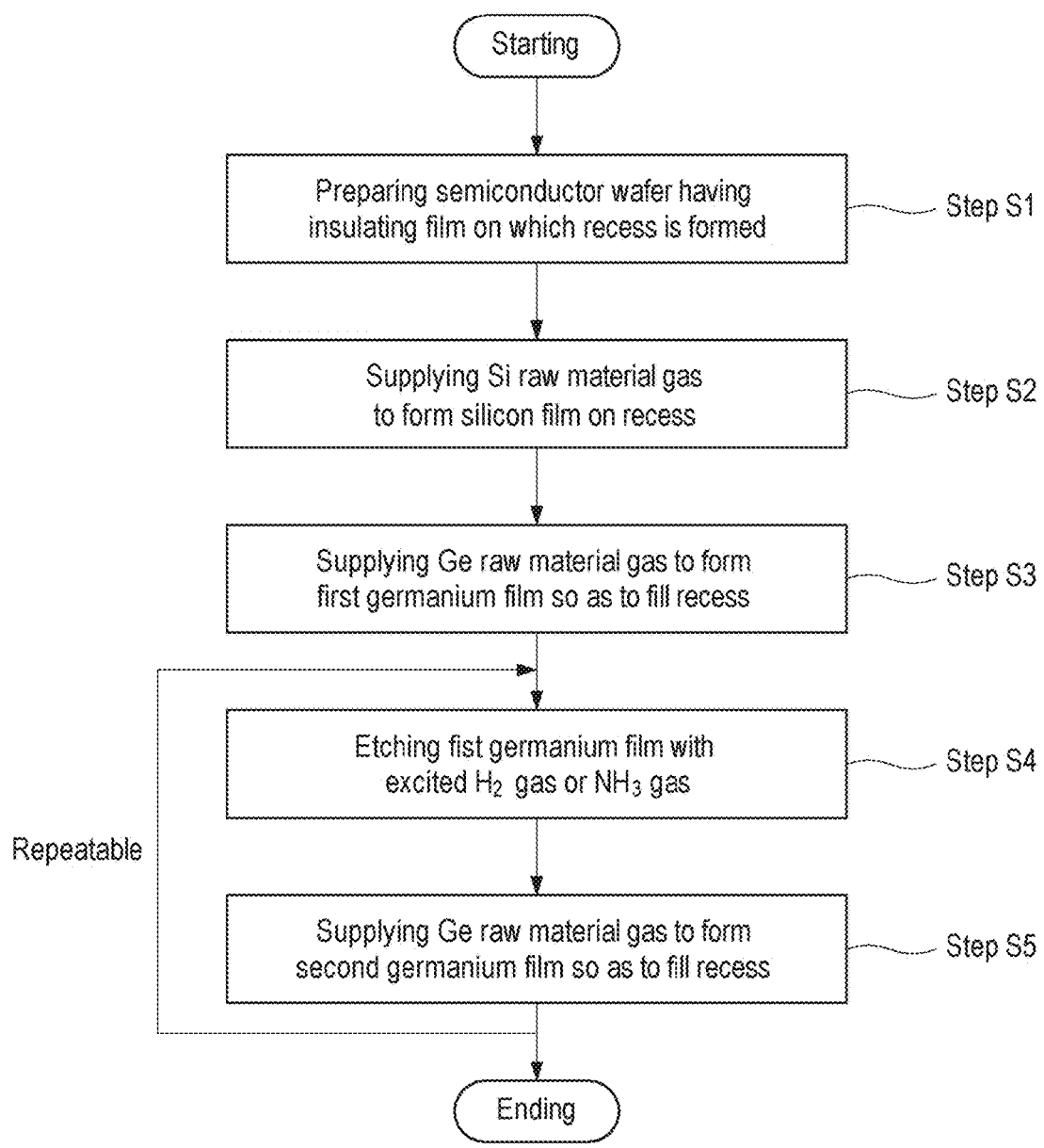

Sample A

Sample B

METHOD OF FILLING RECESS AND PROCESSING APPARATUS

CROSS-REFERENCE TO RELATED APPLICATION

This application is based upon and claims the benefit of priority from Japanese Patent Application No. 2017-066858, filed on Mar. 30, 2017, the entire contents of which are incorporated herein by reference.

TECHNICAL FIELD

The present disclosure relates to a method of filling a germanium film in a recess on a substrate to be processed having an insulating film on which the recess is formed on its surface, and a processing apparatus used therefor.

BACKGROUND

Semiconductor integrated circuit devices need to operate at high speeds. High-speed operation is mainly driven by miniaturization of semiconductor devices such as transistors, reduction in wiring resistance, reduction in dielectric constant of interlayer insulating films, or the like. However, high-speed operation in these technological areas is reaching the limit.

Therefore, in order to promote higher speed operation, germanium (hereinafter, also referred to as Ge) as a semiconductor material having higher carrier mobility has attracted attention, instead of silicon (hereinafter, also referred to as Si) which is conventionally used as a semiconductor material.

Applications for filling Ge as a Ge film in a recess such as a trench or a hole formed on an insulating film such as a silicon oxide film (hereinafter, also referred to as an $SiO_2$ film) or a silicon nitride film (hereinafter, also referred to as an SiN film) by a chemical vapor deposition method (CVD method) are being studied.

However, when the Ge film is filled in a deep hole or trench by the CVD method, the step coverage may deteriorate generating voids. When a void occurs, since the resistance value increases, a method of filling a recess in which as little of a void as possible is generated is needed.

For example, although not a Ge film, a technique of forming a silicon film in a recess such as a hole or a trench, etching it in a V-shaped section, and then filling the silicon film again has been proposed. Thus, void-free filling may be achieved.

Moreover, although a halogen gas or a high-temperature thermal oxidation treatment is used for etching of a Ge film, the selectivity to an insulating film or the like is not sufficient, and when a Ge film is being etched, even other films may be etched. Thus, it is difficult to apply the proposed method to the Ge film. For this reason, a method of filling a Ge film in a recess in a void-free manner has not been accomplished.

SUMMARY

The present disclosure provides some embodiments of a technique capable of suppressing generation of voids and filling a germanium (Ge) film in a recess.

According to one embodiment of the present disclosure, there is provided a method of filling a germanium film in a recess on a substrate to be processed having an insulating film on which the recess is formed on a surface of the substrate, including forming a first germanium film so as to fill the recess by supplying a germanium raw material gas to the substrate, etching the first germanium film with an etching gas containing an excited $H_2$ gas or $NH_3$ gas, and forming a second germanium film on the first germanium film so as to fill the recess by supplying a germanium raw material gas.

According to one embodiment of the present disclosure, there is provided a processing apparatus for filling a germanium film in a recess on a substrate to be processed having an insulating film on which the recess is formed on its surface, including: a process vessel configured to accommodate the substrate, a gas supply part configured to supply a predetermined gas into the process vessel, an excitation mechanism configured to excite the predetermined gas, a heating mechanism configured to heat the interior of the process vessel, an exhaust mechanism configured to exhaust the interior of the process vessel so as to be in a depressurized state, and a control part configured to control the gas supply part, the excitation mechanism, the heating mechanism, and the exhaust mechanism, wherein the control part is configured to: control the interior of the process vessel to be in a predetermined depressurized state by the exhaust mechanism, and control the interior of the process vessel to have a predetermined temperature by the heating mechanism, form a first germanium film so as to fill the recess by supplying a germanium raw material gas from the gas supply part into the process vessel, supply an etching gas containing an $H_2$ gas or an $NH_3$ gas from the gas supply part and excite the etching gas by the excitation mechanism, etch the first germanium film with the excited etching gas in the process vessel, and form a second germanium film on the first germanium film so as to fill the recess by supplying a germanium raw material gas from the gas supply part into the process vessel.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a flowchart illustrating a method of filling a recess according to one embodiment of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Method of Filling Recess>

First, one embodiment of a method of filling a recess according to the present disclosure will be described with reference to a flowchart of FIG. 1 and a process cross-sectional view of FIGS. 2A to 2E.

Figure 2A:
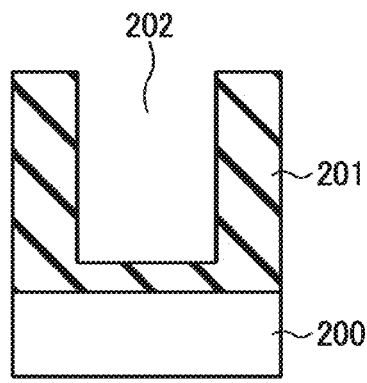
FIGS. 2A to 2E are process cross-sectional views illustrating the method of filling a recess according to one embodiment of the present disclosure.

First of all, a semiconductor wafer (hereinafter, simply referred to as a "wafer") having an insulating film 201 on which a recess 202 such as a trench or a hole is formed in a predetermined pattern and which is formed of an SiO$_2$ film, an SiN film or the like on a semiconductor substrate 200, is prepared (step S1 and FIG. 2A).

For example, the recess 202 may have an opening diameter or an opening width of about 10 to 50 nm and a depth of about 50 to 300 nm.

Figure 2B:
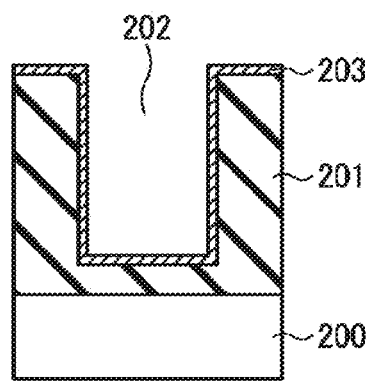

Next, a silicon film, typically an amorphous silicon film 203, is formed (deposited) in the recess 202 (step S2 and FIG. 2B). The formation of the amorphous silicon film 203 at this time is performed by a CVD method using a silicon (Si) raw material gas. The amorphous silicon film 203 becomes a seed layer of a germanium film to be subsequently formed. Therefore, it is not necessary to form a thick amorphous silicon film 203, but it is sufficient if a thin amorphous silicon film is formed on the bottom and the wall surface in the recess 202. The film thickness may vary depending on a size and a shape of the recess 202, but it is desirable that the film thickness be, for example, about 0.1 to 5 nm.

As the Si raw material gas, it may be possible to use any Si-containing compound applicable to the CVD method. That is, it is not particularly limited but it may be possible to suitably use a silane-based compound or an aminosilane-based compound. Examples of the silane-based compound may include monosilane (SiH$_4$), disilane (S$_2$H$_6$) and the like, and examples of the aminosilane-based compound may include butylaminosilane (BAS), bis-tert-butylaminosilane (BTBAS), dimethylaminosilane (DMAS), bisdimethylaminosilane (BDMAS) and the like. Of course, other silane-based gases or aminosilane-based gases may be used.

As specific processing conditions at this time, it may be possible to use a wafer temperature: about 200 to 500 degrees C. and a pressure: about 0.1 to 5 Torr (13.3 to 66.5 Pa).

In addition, a monomolecular seed layer made of aminosilane or the like may be formed prior to the formation of the silicon film 203.

Figure 2C:
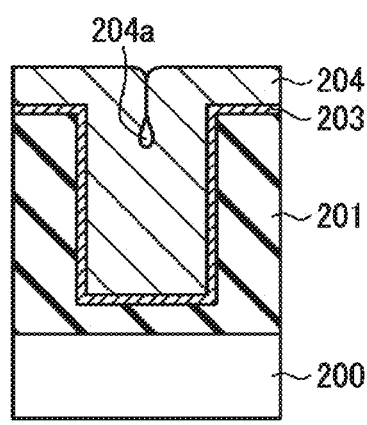

Subsequently, a germanium film 204 (first germanium film) made of germanium (Ge) is formed (deposited) so as to be filled in the recess 202 (step S3 and FIG. 2C). The germanium film 204 is also formed by a CVD method using a Ge raw material gas.

Although the germanium film 204 is not formed on the insulating film, it is formed on silicon. Accordingly, the film is formed on the amorphous silicon film 203 serving as the seed layer previously formed and is filled in the recess 202. At this time, as illustrated in FIG. 2C, when the germanium film 204 is filled in the recess 202, a void 204a is formed in the germanium film. It is not necessary to form the germanium film 204 by the time at which the opening of the recess 202 is blocked and the film formation may be stopped near the time at which an overhang begins to occur.

As the Ge raw material gas, it may be possible to use any Ge-containing compound applicable to the CVD method. That is, it is not particularly limited but it may be possible to suitably use a germane-based compound or an aminogermane-based compound. Examples of the germane-based compound may include monogermane (GeH$_4$), digermane (Ge$_2$H$_6$) and the like, and examples of the aminogermane-based compound may include tris-dimethylamino germane (GeH(NMe$_2$)$_3$), dimethylaminogermane (GeH$_3$(NMe$_2$)$_2$), bis-dimethylamino germane (GeH$_2$(NMe$_2$)$_2$) and the like. Of course, other germane-based gases or aminogermane-based gases may be used.

As specific processing conditions at this time, it may be possible to use a wafer temperature: about 200 to 400 degrees C. and a pressure: about 0.1 to 5 Torr (13.3 to 665 Pa).

Figure 2D:
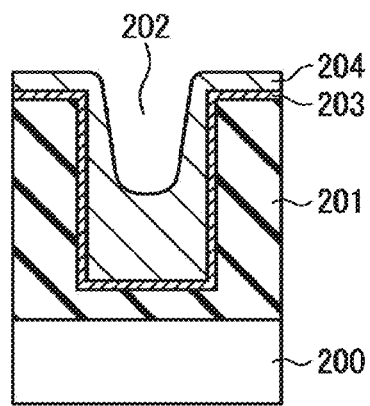

Next, an etching gas containing an H$_2$ gas or an NH$_3$ gas (hereinafter, also referred to simply as an etching gas) is supplied in an excited (plasmized) state, and the germanium film 204 is removed by etching (step S4 and FIG. 2D). Here, since the etching with the excited H$_2$ gas or NH$_3$ gas has anisotropy, the first germanium film 204 is etched so that the cross section of the recess 202 has a V shape or a U shape so as to be in a state in which there is no void or overhang. In addition, since the etching with the excited H$_2$ gas or NH$_3$ gas can etch the germanium film with high selectivity to the silicon-based film, the insulating film 201 or the amorphous silicon film 203 is not etched.

During the etching, the temperature is adjusted to fall within a predetermined range (specifically within a range of 200 to 400 degrees C.) and the internal pressure of a process vessel is adjusted to fall within a predetermined range (specifically within a range of 0.05 to 1 Torr (6.7 to 133 Pa), and the germanium film 204 is etched by introducing a processing gas containing an H$_2$ gas or an NH$_3$ gas in an excited (plasmized) state into the process vessel.

The etching gas may be an H$_2$ gas or an NH$_3$ gas only, or may contain an inert gas, in addition to the H$_2$ gas or the NH$_3$ gas, for example, a rare gas such as an Ar gas or the like.

Figure 2E:
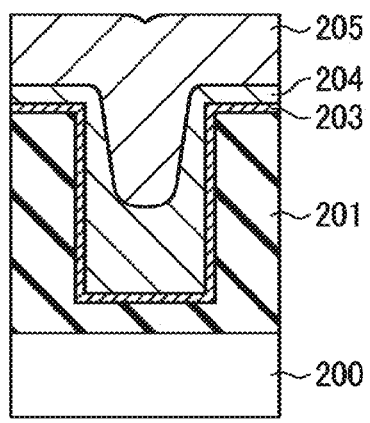

Thereafter, a germanium film 205 (second germanium film) made of germanium (Ge) is formed (deposited) on the germanium film 204 so as to fill the recess formed at step S4 (step S5 and FIG. 2E). At this time, since the void or overhang portion of the germanium film 204 is removed and the cross section of the recess 202 has a V shape or a U shape with the inner diameter of the upper end (upper portion) wider than the inner diameter of the bottom surface (lower portion), the germanium film 205 is filled in the recess 202 while suppressing generation of voids. Furthermore, the formation of the germanium film 205 may be performed under the same processing conditions as those for the formation of the germanium film 204 (first germanium layer).

Since the germanium films 204 and 205 filled in the recess 202 are amorphous, a crystallization process of the germanium films 204 and 205 is performed after the aforementioned process is completed.

The etching at step S4 and the second germanium film forming step at step S5 may be performed only once. However, if it is difficult to fill the germanium films without generating any void in the recess 202 only once depending on a size or a shape of the recess 202, step S4 and step S5 may be repeated a plurality of times.

As described above, according to the present embodiment, after the amorphous silicon film 203 serving as the seed layer is formed in the recess 202 on the wafer having the insulating film 201 on which the recess 202 such as a trench or a hole is formed, the germanium film 204 (first germanium film) made of Ge is formed. Subsequently, the etching gas consisting of the $H_2$ gas or $NH_3$ gas in an excited (plasmized) state is supplied to etch the germanium film 204 so as to have a V-shaped or U-shaped section, and then a germanium raw material gas is supplied to form the germanium film 205 (second germanium film) on the germanium film 204 to fill the recess. Thus, even in a case where the recess 202 is fine, it is possible to fill the germanium films in the recess 202 while suppressing generation of voids.

Furthermore, conventionally, there was no method for etching a germanium film with sufficient selectivity to other films. However, in the present embodiment, the germanium films can be anisotropically etched by a simple method using the excited $H_2$ gas or $NH_3$ gas with high selectivity to other films. Thus, it is possible to realize the filling in which the generation of voids is suppressed as described above almost without etching the insulating film 201 or the amorphous silicon film 203.

<Example of Processing Apparatus>

Figure 3:
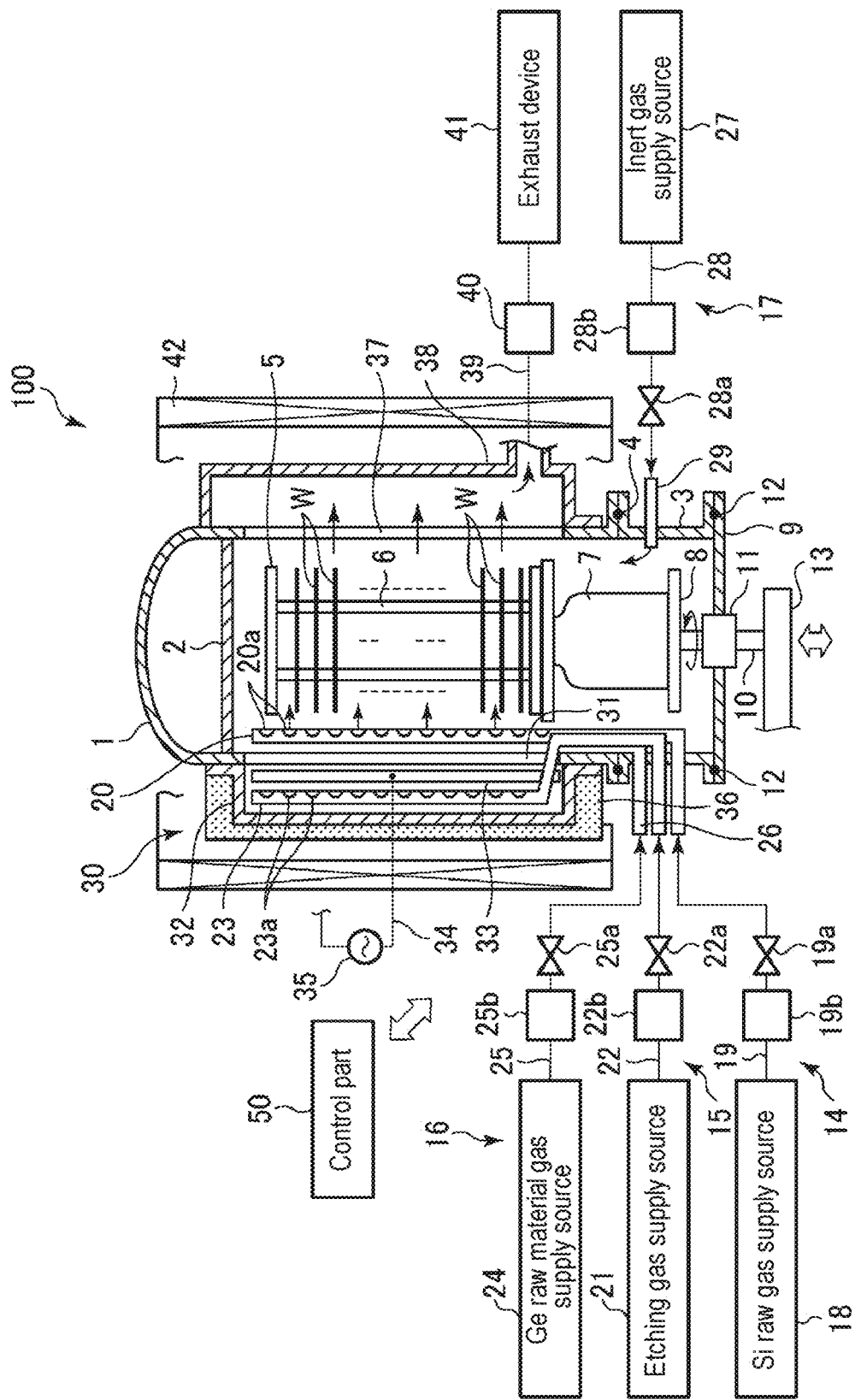
FIG. 3 is a vertical cross-sectional view illustrating an example of a processing apparatus that can be used for performing the method of filling a recess of the present disclosure.
Figure 4:
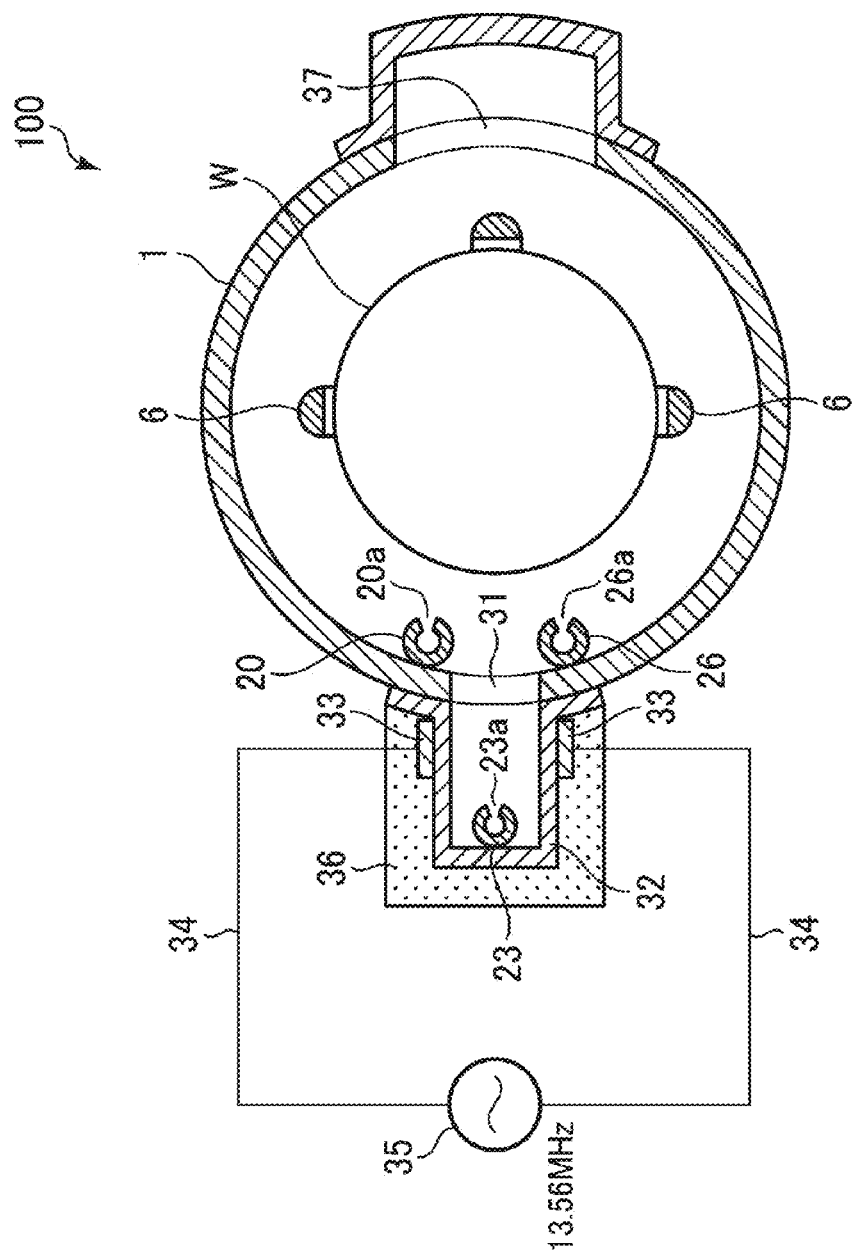
FIG. 4 is a horizontal cross-sectional view illustrating an example of the processing apparatus that can be used for performing the method of filling a recess of the present disclosure.

FIG. 3 is a vertical cross-sectional view illustrating an example of a processing apparatus which can be used for performing a method of filling a recess according to one embodiment of the present disclosure, and FIG. 4 is a horizontal cross-sectional view of the processing apparatus illustrated in FIG. 3.

The processing apparatus 100 of this example has a cylindrical process vessel 1 having a ceiling with its lower end opened. The entire process vessel 1 is made of, for example, quartz. A ceiling plate 2 made of quartz is installed near an upper end of the process vessel 1 to seal its lower region. In addition, a manifold 3 made of metal and having a cylindrical shape is connected to a lower end opening of the process vessel 1 through a seal member 4 such as an O ring.

It is configured such that the manifold 3 supports the lower end of the process vessel 1, and a wafer boat 5 made of quartz in which a plurality of wafers W, for example, 50 to 100 semiconductor wafers (silicon wafers), as substrates to be processed are stacked in multiple stages from the lower side of the manifold 3 is inserted into the process vessel 1. The wafer boat 5 has three rods 6 (see FIG. 4), and the plurality of wafers W are supported by grooves (not shown) formed in the rods 6.

The wafer boat 5 is loaded on a table 8 through a heat insulating tube 7 made of quartz, and this table 8 is supported on a rotary shaft 10 which penetrates a lid member 9 made of metal (stainless steel) that opens and closes the lower end opening of the manifold 3.

In addition, a magnetic fluid seal 11 is installed at the penetrating portion of the rotary shaft 10 so as to rotatably support the rotary shaft 10 while hermetically sealing it. A seal member 12 for maintaining the sealing property within the process vessel 1 is interposed between the peripheral portion of the lid member 9 and the lower end portion of the manifold 3.

The rotary shaft 10 is installed at a leading end of an arm 13 supported by, for example, an elevating mechanism (not shown) such as a boat elevator, and the wafer boat 5, the lid member 9 and the like are moved up integrally so as to be inserted into or separated from the process vessel 1. Furthermore, the table 8 may be fixedly installed on the lid member 9 side so that the wafers W may be processed without rotating the wafer boat 5.

The processing apparatus 100 further includes an Si raw material gas supply mechanism 14 for supplying an Si raw material gas into the process vessel 1, an etching gas supply mechanism 15 for supplying an etching gas, for example, an $H_2$ gas or an $NH_3$ gas, into the process vessel 1, a Ge raw material gas supply mechanism 16 for supplying a Ge raw material gas into the process vessel 1, and an inert gas supply mechanism 17 for supplying an inert gas, for example, an $N_2$ gas or an Ar gas, as a purge gas or the like into the process vessel 1.

The Si raw material gas supply mechanism 14 includes an Si raw material gas supply source 18, a gas pipe 19 for guiding the Si raw material gas from the Si raw material gas supply source 18, and a gas dispersion nozzle 20 connected to the gas pipe 19 for guiding the Si raw material gas into the process vessel 1. The Si raw material gas may include a silane-based compound, an aminosilane-based compound, and the like.

The etching gas supply mechanism 15 includes an etching gas supply source 21, a gas pipe 22 for guiding the etching gas from the etching gas supply source 21, and a gas dispersion nozzle 23 for guiding the etching gas into the process vessel 1. Examples of the etching gas may include an $H_2$ gas, an $NH_3$ gas, and the like. In this processing apparatus 100, the etching gas consists of an $H_2$ gas or an $NH_3$ gas, but the $H_2$ gas or the $NH_3$ gas may be diluted with a rare gas such as an Ar gas or the like and then supplied.

The Ge raw material gas supply mechanism 16 includes a Ge raw material gas supply source 24, a gas pipe 25 for guiding a Ge gas from the Ge raw material gas supply source 24, and a gas dispersion nozzle 26 for guiding the Ge gas into the process vessel 1. The Ge raw material gas may include a germane-based compound, an aminogermane-based compound, and the like.

The gas dispersion nozzles 20, 23, and 26 are made of quartz, penetrate a sidewall of the manifold 3 inwardly, are bent upward, and extend vertically. A plurality of gas discharge holes 20a, 23a, and 26a (where 26a is shown only in FIG. 4) are respectively formed in vertical portions of these gas dispersion nozzles 20, 23, and 26 at predetermined intervals along a length in a vertical direction corresponding to the wafer support range of the wafer boat 5. Thus, it is possible to discharge the gas substantially uniformly from the respective gas discharge holes 20a, 23a, and 26a toward the process vessel 1 in a horizontal direction. The respective gas dispersion nozzles 20, 23 and 26 installed is only one in number. The respective two or more gas dispersion nozzles 20, 23 and 26 may also be installed.

The inert gas supply mechanism 17 includes an inert gas supply source 27, a gas pipe 28 for guiding the inert gas from the inert gas supply source 27, and a gas nozzle 29 which is connected to the gas pipe 28, installed so as to penetrate the sidewall of the manifold 3, and made of a short quartz tube.

Opening/closing valves 19a, 22a, 25a, and 28a and flow e controllers 19b, 22b, 25b, and 28b are installed in the gas pipes 19, 22, 25, and 28, respectively.

A plasma generation mechanism 30 is formed in a portion of the sidewall of the process vessel 1. The plasma generation mechanism 30 serves to excite (i.e., plasmize) an etching gas which consists of an $H_2$ gas or an $NH_3$ gas and supply it into the process vessel 1.

The plasma generation mechanism 30 includes a plasma partition wall 32 which is hermetically welded to the outer wall of the process vessel 1. The plasma partition wall 32 is made of, for example, quartz. The plasma partition wall 32 is recessed in section and covers an opening 31 formed in the sidewall of the process vessel 1. The opening 31 is elongated in the vertical direction so as to vertically cover all the semiconductor wafers W supported by the wafer boat 5. The dispersion nozzle 23 for discharging the etching gas described above is disposed in the inner space defined by the plasma partition wall 32, namely within the plasma generation space. Furthermore, the gas dispersion nozzle 20 and the gas dispersion nozzle 26 for discharging the Si raw material gas and the Ge raw material gas are respectively installed at positions with the opening 31 through the inner sidewall of the process vessel 1 interposed therebetween.

The plasma generation mechanism 30 further includes a pair of elongated plasma electrodes 33 arranged on the outer surfaces of both sidewalls of the plasma partition wall 32 so as to face each other along the vertical direction, and a high-frequency power source 35 which is connected to each of the pair of plasma electrodes 33 via a power supply line 34 to supply high-frequency power to the pair of plasma electrodes 33. The high-frequency power source 35 applies a high-frequency voltage of, for example, 13.56 MHz, to the pair of plasma electrodes 33. Thus, a high-frequency electric field is applied into the plasma generation space defined by the plasma partition wall 32. The etching gas discharged from the dispersion nozzle 23 is plasmized (excited) within the plasma generation space to which the high-frequency electric field is applied, and the plasmized etching gas is supplied into the process vessel 1 through the opening 31.

An insulation protection cover 36 is installed at an outer side of the plasma partition wall 32 so as to cover it. A refrigerant passage (not shown) is installed in the inner portion of the insulation protection cover 36, and the plasma electrodes 33 are cooled by allowing a refrigerant such as a cooled nitrogen gas to flow therethrough.

An exhaust port 37 configured to vacuum-exhaust the interior of the process vessel 1 is installed in the sidewall portion of the process vessel 1 located opposite the opening 31. The exhaust port 37 is vertically elongated so as to correspond to the wafer boat 5. An exhaust port cover member 38 formed to have a U-shaped section so as to cover the exhaust port 37 is installed at a portion corresponding to the exhaust port 37 of the process vessel 1. The exhaust port cover member 38 extends upward along the sidewall of the process vessel 1. An exhaust pipe 39 for exhausting the interior of the process vessel 1 via the exhaust port 37 is connected to a lower portion of the exhaust port cover member 38. A pressure control valve 40 for controlling the internal pressure of the process vessel 1 and an exhaust device 41 including a vacuum pump and the like are connected to the exhaust pipe 39 such that the interior of the process vessel 1 is exhausted by the exhaust device 41 through the exhaust pipe 39. In addition, a cylindrical heating mechanism 42 for heating the process vessel 1 and the wafers W therein is installed so as to surround an outer periphery of the process vessel 1.

The processing apparatus 100 has a control part 50. The control part 50 performs controls of the respective components of the processing apparatus 100, for example, the supply and stop of each gas by opening and closing the valves 19a, 22a, 25a, and 28a, the gas flow rate control by the flow rate controllers 19b, 22b, 25b, and 28b, the exhaust control by the exhaust device 41, the on/off control of high-frequency power by the high-frequency power source 35, the temperature control of the wafer W by the heating mechanism 42, and the like. The control part 50 includes a main control part which has a CPU (computer) and performs the controls described above, an input device, an output device, a display device, and a storage device. A storage medium storing a program for controlling a process to be executed by the processing apparatus 100, i.e., a process recipe, is set in the storage device, and the main control part invokes a predetermined process recipe stored in the storage medium and controls operations such that a predetermined processing is performed by the processing apparatus 100 based on the process recipe.

<Processing by Processing Apparatus 100>

Next, a processing operation when the method of filling a recess as described above is performed by the processing apparatus configured as described above will be described. The following processing operation is executed based on the process recipe stored in the storage medium of the storage part in the control part 50.

First, for example, 50 to 150 semiconductor wafers W, each having an insulating film on which a recess such as a trench or a hole of a predetermined pattern as described above is formed, are mounted on the wafer boat 5, and the wafer boat 5 having the wafers W mounted thereon is loaded on a turntable 8 through the heat insulating tube 7 made of quartz and moved up by the elevating mechanism (not shown) such as the boat elevator so that the wafer boat 5 is carried into the process vessel 1 from the lower opening.

At this time, the interior of the process vessel 1 is heated in advance by the cylindrical heating mechanism 42 such that the internal temperature of the process vessel 1 becomes a temperature appropriate for forming an amorphous silicon film, for example, a predetermined temperature which falls within a range of 200 to 500 degrees C. Then, an inert gas is supplied into the process vessel 1 so that the interior of the process vessel 1 is adjusted to have a pressure of 0.1 to 5 Torr (13.3 to 665 Pa). Thereafter, the valve 19a is opened and, for example, a silane ($SiH_4$) gas, is supplied as an Si raw material gas from the Si raw material gas supply source 18 into the process vessel 1 through the Si raw material gas pipe 19 to form an amorphous silicon film at a predetermined temperature which falls within a range of 200 to 500 degrees C. while rotating the wafer boat 5. The flow rate of the gas at this time is controlled by the flow rate controller 19b to become a predetermined flow rate which falls within a range of 50 to 1,000 sccm. When the film thickness reaches a point where an amorphous silicon film serving as a seed layer is formed in the recess 202, the valve 19a is closed and the formation of the amorphous silicon film is completed.

Subsequently, the interior of the process vessel 1 is exhausted by the exhaust device 41 via the exhaust pipe 39, and the valve 28a is opened to supply an inert gas such as an $N_2$ gas from the inert gas supply source 27 into the process vessel 1. Thus, the interior of the process vessel 1 is purged and the internal temperature of the process vessel 1 is adjusted by the heating mechanism 42 to an appropriate temperature for forming a germanium film, for example, a predetermined temperature which falls within a range of 200 to 400 degrees C. Then, after adjusting the internal pressure of the process vessel 1 to have about 0.1 to 5 Torr (13.3 to 665 Pa), the valve 25a is opened to supply, for example, a monogermane ($GeH_4$) gas, as a Ge raw material gas from the Ge raw material gas supply source 24 into the process vessel 1 via the Ge raw material gas pipe 25. Thus, a germanium film (first germanium film) is formed at a predetermined temperature which falls within a range of 200 to 400 degrees C. while rotating the wafer boat 5, to fill the recess. The flow rate of the gas at this time is controlled by the flow rate controller 25b to become a predetermined flow rate which falls within a range of 50 to 1,000 sccm. When the thickness of the germanium film (first germanium film) reaches a predetermined film thickness, the valve 25b is closed and the processing is completed.

Next, the interior of the process vessel 1 is exhausted by the exhaust device 41 via the exhaust pipe 39, and the valve 28a is opened to supply an inert gas such as an $N_2$ gas from the inert gas supply source 27 into the process vessel 1. Thus, the interior of the process vessel 1 is purged and the interior temperature of the process vessel 1 is controlled by the heating mechanism 42 to become a predetermined temperature which falls within a range of 200 to 400 degrees C. Then, the inert gas is supplied into the process vessel 1 so that the interior of the process vessel 1 has a pressure which falls within a range of 0.05 to 1 Torr (6.7 to 133 Pa). Subsequently, the valve 28a is closed, the valve 22a is opened, and an $H_2$ gas or an $NH_3$ gas is discharged from the dispersion nozzle 23 from the etching gas supply source 21 via the etching gas pipe 22, and is plasmized (excited) within the plasma generation space where a high-frequency electric field is formed and supplied into the process vessel 1 through the opening 31 to etch the germanium film (first germanium film). The flow rate of the gas at this time is controlled by the flow rate controller 22b to become a predetermined flow rate which falls within a range of 100 to 10,000 sccm. Since the etching with the plasmized (excited) $H_2$ gas or $NH_3$ gas has anisotropy, the germanium film (first germanium film) is etched into a V shape or a U shape in section. Then, after a predetermined time preset to have a predetermined etching shape has elapsed, the valve 22a is closed and the etching is completed.

Next, the interior of the process vessel 1 is exhausted and purged, and the interior temperature of the process vessel 1 is controlled by the heating mechanism 42 to become a temperature appropriate for forming a germanium film, for example, a predetermined temperature which falls within a range of 200 to 400 degrees C., in the same manner as described above. Then, after adjusting the interior pressure of the process vessel 1 to have about 0.1 to 5 Torr (13.3 to 665 Pa), the valve 25a is opened to supply, for example, a monogermane ($GeH_4$) gas, as a Ge raw material gas from the Ge raw material gas supply source 24 into the process vessel 1 via the Ge raw material gas pipe 25. Thus, the germanium film (second germanium film) is formed at a predetermined temperature which falls within a range of 200 to 400 degrees C. while rotating the wafer boat 5. The flow rate of the gas at this time is controlled by the flow rate controller 25b to become a predetermined flow rate which falls within a range of 50 to 1,000 sccm. The formation of the germanium film (the second germanium film) is performed for a time period until it reaches a predetermined film thickness to fill the V-shaped or U-shaped recess of the previously formed germanium film (first germanium film), and thereafter, the valve 25b is closed and the processing is completed.

Thus, as described above, although the recess is fine, it is possible to fill the germanium film in the recess while suppressing generation of voids.

When the film formation is performed for a predetermined period of time and the interior of the recess is filled with the germanium film (second germanium film), the valve 25b is closed and the film formation is completed. Thereafter, the interior of the process vessel 1 is purged by the exhaust device 41 with an inert gas while exhausting the interior of the process vessel 1 via the exhaust pipe 39. Then, after the interior of the process vessel 1 is returned to an atmospheric pressure, the wafer boat 5 is moved down by the elevating mechanism (not shown), and is unloaded from the interior of the process vessel 1.

As described above, since the processing apparatus 100 can process the plurality of wafers at a time and all the steps of the process of filling the recess can be continuously performed in the process vessel 1, the throughput of the processing is extremely high. In addition, from the viewpoint of further increasing the throughput, it is desirable to minimize the temperature difference between the respective steps as much as possible.

Actual conditions may be exemplified as follows:
Number of wafers: 150 sheets
Amorphous silicon film formation
Temperature: 400 degrees C. or lower
Pressure: 2.0 Torr (266.6 Pa)
$SiH_4$ gas flow rate: 1,000 sccm
Ge film filling
Temperature: 300 degrees C.
Pressure: 0.1 to 1 Torr (13.3 to 133.3 Pa)
$GeH_4$ gas flow rate: 700 sccm
Etching
Temperature: 300 degrees C.
Pressure: 0.1 to 0.5 Torr (13.3 to 66.5 Pa)
RF power: 100 to 500 W
$NH_3$ gas flow rate: 500 to 50,000 sccm
$H_2$ gas flow rate: 200 to 20,000 sccm.

EXPERIMENTAL EXAMPLE 1

Next, experimental example 1 will be described.

Figure 5A:
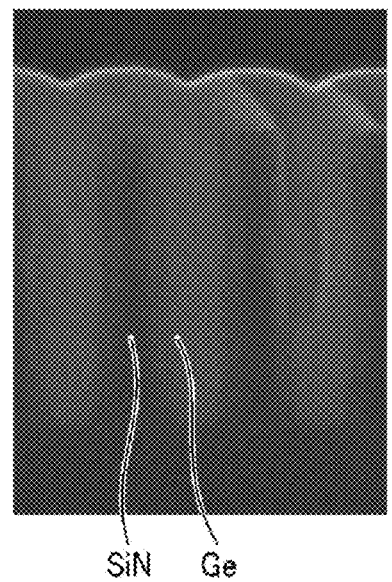
FIGS. 5A to 5C are SEM photographs showing a cross section of a sample wafer (in full filling) in experimental example 1.
Figure 5B:
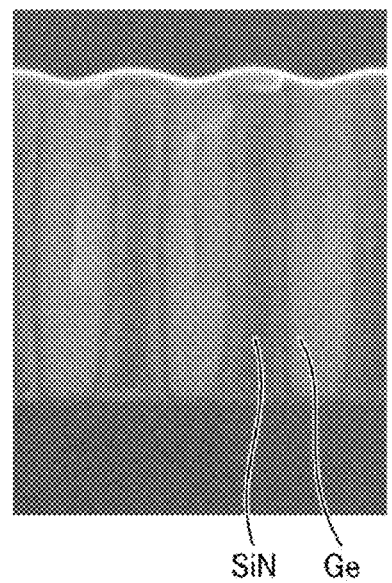
Figure 5C:
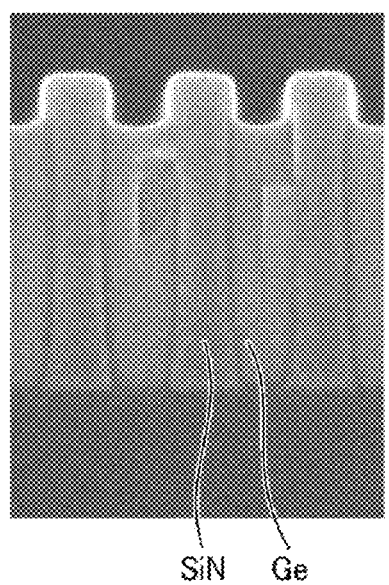
Figure 6A:
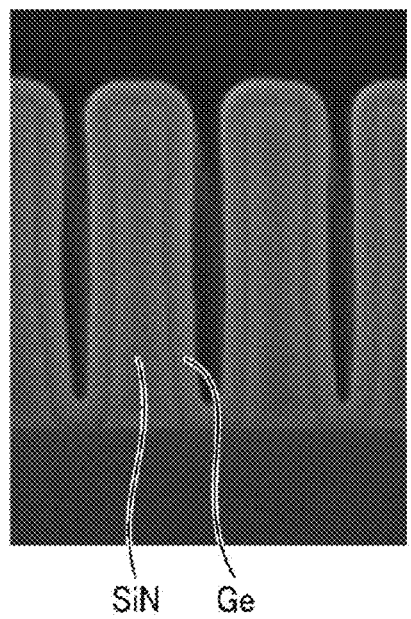
FIGS. 6A to 6C are SEM photographs showing a cross section of a sample wafer (in half filling) in experimental example 1.
Figure 6B:
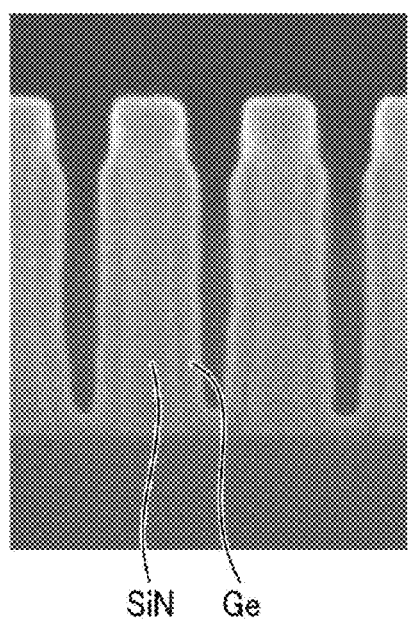
Figure 6C:
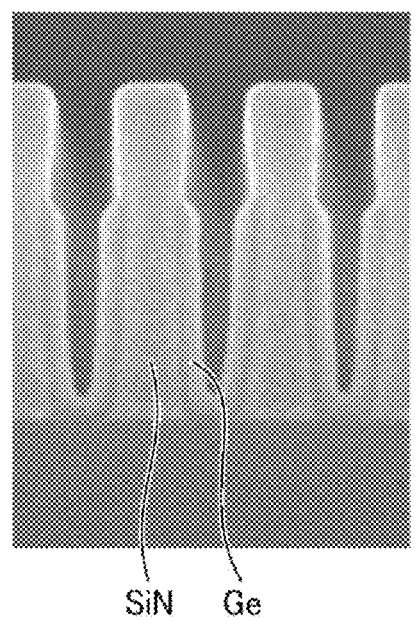

FIGS. 5A to 5C and 6A to 6C are SEM photographs showing cross sections of a sample wafer in experimental example 1. FIGS. 5A to 5C are SEM photographs showing a cross section of a sample wafer in which a recess formed on an insulating film is fully filled or filled with a Ge film (Full Filling). FIGS. 6A to 6C are SEM photographs showing a cross section of a sample wafer in which a recess formed on an insulating film is filled or filled with a Ge film by about half (Half Filling).

FIG. 5A shows that a sample wafer was prepared by forming a recess having a width of 40 nm and a depth of 184 nm in a predetermined pattern on an SiN film formed on an Si substrate and an filling process was performed on the sample wafer using the processing apparatus of FIGS. 3 and 4.

First, an amorphous silicon film was formed on a sample wafer using a disilane ($Si_2H_6$) gas as an Si raw material gas. At this time, the film was formed with a film thickness so as to serve as a seed layer under the conditions of a wafer temperature: 200 to 400 degrees C., a pressure: 0.1 to 5 Torr (13.3 to 5 Pa), and a flow rate of an $SiH_4$ gas: 50 to 1,000 sccm.

Subsequently, a Ge film was filled using a monogermane ($GeH_4$) gas as a Ge raw material gas. At this time, as illustrated in FIG. 5A, the film was formed to be in a state in which a recess is fully filled or filled with the Ge film (Full Filling) under the conditions of a wafer temperature: 300 degrees C., a pressure: 0.1 to 1 Torr (13.3 to 133.3 Pa), and a flow rate of a $GeH_4$ gas: 700 sccm. The thickness of the germanium film is about 36 nm at the top of the SiN film.

Furthermore, the thickness from the bottom of the recess to the surface of the germanium film is about 220 nm.

Next, the germanium film was etched using an $H_2$ gas as an etching gas. At this time, the germanium film was etched under the conditions of a wafer temperature: 300 degrees C., a pressure: 0.1 to 0.5 Torr (13.3 to 66.5 Pa), a flow rate of an $H_2$ gas: 2,000 sccm, and an RF power: 500 W, for 10 minutes and 20 minutes.

FIG. 5B is an SEM photograph showing a cross section of the recess after etching for 10 minutes. By the etching for 10 minutes, the thickness from the bottom of the recess to the surface of the germanium film is 200 nm. Furthermore, FIG. 5C is an SEM photograph showing a cross section of the recess after etching for 20 minutes. By the etching for 20 minutes, the germanium film is etched up to the middle of the recess, and a portion (upper end) of the SiN film is exposed. The thickness from the bottom of the recess formed on the SiN film to the surface of the germanium film is 170 nm.

FIG. 6A shows that an filling process was performed on a sample wafer similar to that of FIG. 5A using the processing apparatus of FIGS. 3 and 4. The film forming conditions and the etching conditions are the same as those of the sample shown in FIGS. 5A to 5C.

First, an amorphous silicon film was formed on a sample wafer using a monosilane ($SiH_4$) gas as an Si raw material gas. Subsequently, a Ge film was filled using a $GeH_4$ gas as a Ge raw material gas, and the film was formed to be in a state in which a recess was filled or filled with a Ge film by about half (Half Filling), as shown in FIG. 6A. The thickness of the germanium film is about 14 nm at the top of the SiN film and at the bottom of the recess. Furthermore, the thickness from the bottom of the recess to the surface of the germanium film is about 220 nm.

Next, the germanium film was etched using an $H_2$ gas as an etching gas. FIG. 6B is an SEM photograph showing a cross section of the recess after etching for 10 minutes. By the etching for 10 minutes, the germanium film was removed up to the position of 160 nm from the bottom of the recess. In addition, the thickness of germanium at the bottom of the recess is 13 nm, which can show that it is hardly etched. FIG. 6C is an SEM photograph showing a cross section of the recess after etching for 20 minutes. By the etching for 20 minutes, the germanium film was removed up to the position of 130 nm from the bottom of the recess. In addition, the thickness of germanium at the bottom of the recess is 13 nm, which can show that it is hardly etched.

From the above, it can be seen that, when an etching treatment is performed using an $H_2$ gas as an etching gas, only the germanium film is etched and the SiN film is not etched. It can also be seen that the germanium film is etched from the top to the bottom. From the above, it can be seen that the etching of the germanium film has anisotropy and also has high selectivity to the SiN film.

Moreover, through experimental example 1, only a filling of a germanium film corresponding to the first germanium film in the recess of the SiN film corresponding to the insulating film, and then etching the germanium film are assessed. However, since the etching of the germanium film has anisotropy and the germanium film is selectively etched with respect to the SiN film, it is obvious that the germanium (Ge) film can be filled in the recess while suppressing generation of voids by forming the second germanium film after the etching of the first germanium film.

In addition, it was confirmed that the anisotropic etching of the germanium film can be performed by an $H_2$ gas plasma despite using a remote plasma to which a bias is not applied.

EXPERIMENTAL EXAMPLE 2

Next, experimental example 2 will be described.

Figure 7A:
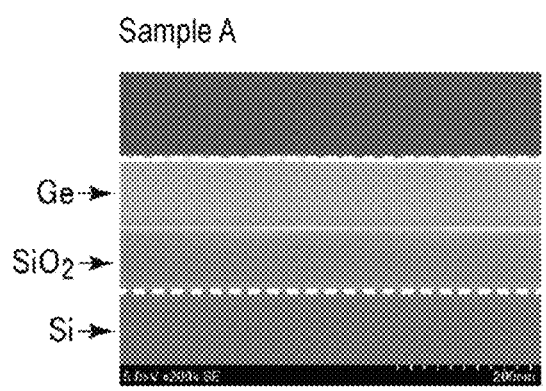
FIGS. 7A and 7B are SEM photographs showing a cross section of a blanket sample before etching treatment (initial stage) in experimental example 2.
Figure 7B:
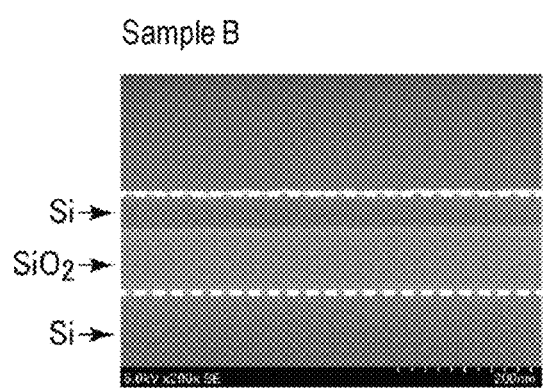

FIGS. 7A and 7B are SEM photographs showing a cross section of a blanket sample before etching treatment (initial stage) in experimental example 1. In experimental example 2, blanket samples (hereinafter, referred to as "samples") in which a thermally oxidized $SiO_2$ film, a germanium film, or a silicon film is formed in the same order on an Si substrate as illustrated in FIGS. 7A and 7B were prepared (samples A and B), an etching treatment of the germanium film was performed on these samples using the processing apparatus of FIGS. 3 and 4.

The etching treatment was performed on these samples A and B with a plasmized $NH_3$ gas or $H_2$ gas.

The etching conditions are as follows:
Temperature: 300 degrees C.
Pressure: 0.2 Torr (26.6 Pa)
$NH_3$ gas flow rate: 5 slm (5,000 sccm)
$H_2$ gas flow rate: 2 slm (2,000 sccm)
RF power: 500 W
Processing time: 30 min.

It should be noted that the gas flow rate during the etching treatment is 5 slm (5,000 sccm) for the $NH_3$ gas, but 2 slm (2,000 sccm) for the $H_2$ gas.

[Etching by $NH_3$ Gas Plasma]

Figure 8A:
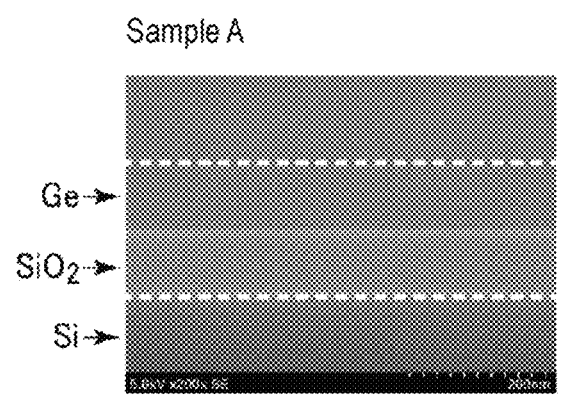
FIGS. 8A and 8B are SEM photographs showing a cross section of a blanket sample after etching treatment (post treatment) with an NH$_3$ gas in experimental example 2.
Figure 8B:
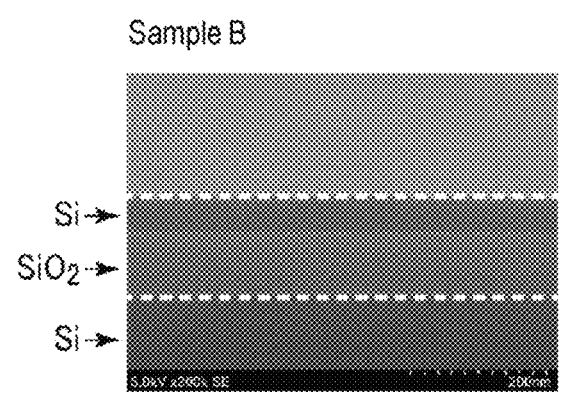

FIGS. 8A and 8B are SEM photographs showing cross sections of samples A and B after etching treatment with an $NH_3$ gas (Post Treatment) in experimental example 1. Specifically, FIG. 8A is an SEM photograph showing a cross section after etching treatment of a sample A and FIG. 8B is an SEM photograph showing a cross section after etching treatment of a sample B.

From the SEM photograph shown in FIG. 8A, it can be seen that, when the etching treatment is performed using an $NH_3$ gas as an etching gas, a germanium film on a thermally oxidized $SiO_2$ film is completely etched and removed. It can also be seen that the thermally oxidized $SiO_2$ film remains unetched. In addition, from the SEM photograph shown in FIG. 8B, it can be seen that a silicon film remains unetched.

From the above, it can be seen that the germanium film can be etched using the plasmized $NH_3$ gas and the $SiO_2$ film and the silicon film are not etched. That is, it was confirmed that the germanium film was selectively etched with respect to the $SiO_2$ film and the silicon film.

[Etching by $H_2$ Gas Plasma]

Figure 9A:
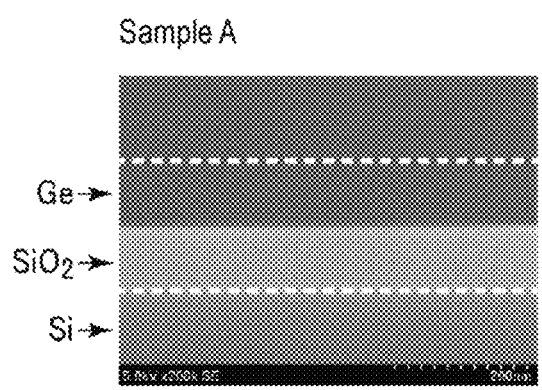
FIGS. 9A and 9B are SEM photographs showing a cross section of a blanket sample after etching treatment (post treatment) with an H$_2$ gas in experimental example 2.
Figure 9B:
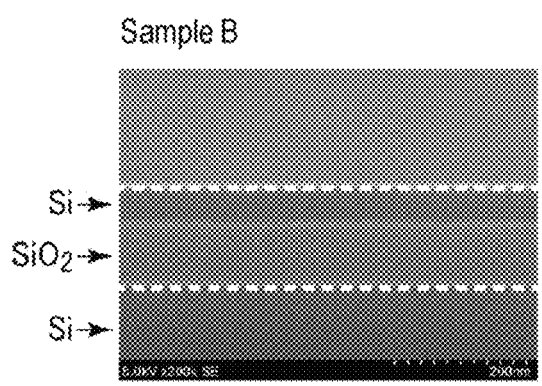

FIGS. 9A and 9B are SEM photographs showing cross sections of samples A and B after etching treatment with an $H_2$ gas (Post Treatment) in experimental example 1. Specifically, FIG. 9A is an SEM photograph showing a cross section after etching treatment of a sample A and FIG. 9B is an SEM photograph showing a cross section after etching treatment of a sample B.

From the SEM photograph shown in FIG. 9A, it can be seen that, when the etching treatment is performed using an $H_2$ gas as an etching gas, a germanium film on a thermally oxidized $SiO_2$ film is completely etched and removed. It can also be seen that the thermally oxidized $SiO_2$ film remains unetched. In addition, from the SEM photograph shown in FIG. 9B, it can be seen that a silicon film remains unetched.

From the above, it can be seen that the germanium film can be etched using a plasmized $H_2$ gas, and the $SiO_2$ film and the silicon film are not etched. That is, it was confirmed that the germanium film was selectively etched with respect to the SiO$_2$ film and the silicon film.

<Other Applications>

While the embodiment of the present disclosure has been described above, the present disclosure is not limited to the aforementioned embodiment but may be differently modified without departing from the spirit of the present disclosure.

For example, in the aforementioned embodiment, there has been described an example in which the method of the present disclosure is performed by a vertical batch-type apparatus. However, the present disclosure is not limited thereto and may be performed by various etching apparatuses such as a horizontal batch-type apparatus (an apparatus of a type where a plurality of vertically placed wafers are arranged in a horizontal direction and the plurality of arranged wafers are processed at a time) and a single-wafer-type apparatus (an apparatus of a type where horizontally placed wafers are processed one by one).

Furthermore, in the aforementioned embodiment, there has been described an example in which plasma is generated by applying high-frequency power to a pair of plasma electrodes. However, the method of generating plasma is not limited thereto and the plasma may be generated by other methods such as inductive coupling or microwave.

In addition, there has been described a case where a semiconductor wafer is used as a substrate to be processed. However, it is to be understood that the present disclosure is not limited thereto and may be applied to other substrates such as a glass substrate for a flat panel display and a ceramic substrate.

According to the present disclosure in some embodiments, after filling a first germanium film in a recess, etching with high anisotropy and selectivity is performed with an excited H$_2$ gas or NH$_3$ gas so that a cross section of a first germanium film has a V shape or a U shape, and thereafter, a second germanium film is filled, while suppressing etching of other films. Thus, it is possible to realize filling of the germanium film in which generation of voids is suppressed.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A method of filling a germanium film in a recess on a substrate to be processed having an insulating film on which the recess is formed on a surface of the substrate, comprising:

forming a silicon film on a surface of the insulating film having the recess formed thereon;

forming a first germanium film on the silicon film so as to fill the recess by supplying a germanium raw material gas to the substrate;

etching the first germanium film with an etching gas containing an excited H$_2$ gas or NH$_3$ gas; and forming a second germanium film on the first germanium film so as to fill the recess by supplying a germanium raw material gas, wherein, in the act of etching, the first germanium film is selectively etched with respect to the insulating film and the silicon film.

2. A processing apparatus for filling a germanium film in a recess on a substrate to be processed having an insulating film on which the recess is formed on its surface, comprising:

a process vessel configured to accommodate the substrate;

a gas supply part configured to supply a predetermined gas into the process vessel;

an excitation mechanism configured to excite the predetermined gas;

a heating mechanism configured to heat the interior of the process vessel;

an exhaust mechanism configured to exhaust the interior of the process vessel so as to be in a depressurized state; and a control part configured to control the gas supply part, the excitation mechanism, the heating mechanism, and the exhaust mechanism, wherein the control part is configured to:

control the interior of the process vessel to be in a predetermined depressurized state by the exhaust mechanism, and control the interior of the process vessel to have a predetermined temperature by the heating mechanism;

form a silicon film on a surface of the insulating film having the recess formed thereon;

form a first germanium film on the silicon film so as to fill the recess by supplying a germanium raw material gas from the gas supply part into the process vessel;

supply an etching gas containing an H$_2$ gas or an NH$_3$ gas from the gas supply part and excite the etching gas by the excitation mechanism;

etch the first germanium film with the excited etching gas in the process vessel; and form a second germanium film on the first germanium film so as to fill the recess by supplying a germanium raw material gas from the gas supply part into the process vessel, wherein, in the act of etching, the first germanium film is selectively etched with respect to the insulating film and the silicon film.

* * * * *